United States Patent
Bakir et al.

(10) Patent No.: US 7,266,797 B2
(45) Date of Patent: Sep. 4, 2007

(54) AUTOMATED AND ELECTRICALLY ROBUST METHOD FOR PLACING POWER GATING SWITCHES IN VOLTAGE ISLANDS

(75) Inventors: Lu'Ay Bakir, Bolton Valley, VT (US); Joseph Kozhaya, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 10/908,619

(22) Filed: May 19, 2005

(65) Prior Publication Data

US 2006/0265681 A1  Nov. 23, 2006

(51) Int. Cl.
G06F 17/50 (2006.01)
(52) U.S. Cl. ........................................ 716/10
(58) Field of Classification Search ............... 716/10, 716/2, 5, 9
See application file for complete search history.

(56) References Cited

U.S. PATENT DOCUMENTS

| | | | |
|---|---|---|---|
| 5,598,348 A * | 1/1997 | Rusu et al. ..................... 716/2 |
| 5,878,053 A * | 3/1999 | Koh et al. ................... 714/724 |
| 6,493,859 B1 | 12/2002 | Gould et al. | |
| 6,631,502 B2 | 10/2003 | Buffet et al. | |
| 6,975,978 B1 * | 12/2005 | Ishida et al. ................... 703/15 |
| 2004/0172603 A1 * | 9/2004 | Collmeyer et al. ............. 716/1 |
| 2005/0091629 A1 * | 4/2005 | Eisenstadt et al. ............ 716/13 |
| 2005/0270074 A1 * | 12/2005 | Hardee ........................ 327/112 |
| 2006/0114025 A1 * | 6/2006 | Frenkil et al. ................. 326/81 |
| 2006/0117282 A1 * | 6/2006 | Frenkil ........................... 716/5 |

* cited by examiner

Primary Examiner—Paul Dinh
Assistant Examiner—Suchin Parihar
(74) Attorney, Agent, or Firm—W. Riyon Harding

(57) ABSTRACT

An efficient and automated algorithm for placing power gating switches within a voltage island of an integrated circuit, which ensures compliance with defined electrical specifications. A power gating switch is placed in every legal location on the integrated circuit and the minimum number of power gating switches is calculated based on current requirements of the voltage island. Each power gating switch is modeled as an ideal resistor whose value is obtained from the slope of the I-V curve of the switch when operating in the linear region. The power distribution networks of the integrated circuit and the voltage island are extracted and modeled as a resistive network. Circuit macros placed within the voltage island are modeled as current sources. The extracted linear network is then simulated using a DC stimulus to obtain expected voltage drops across the voltage island as well as the currents in all branches of the voltage island power grid and through each power gating switch. The process iterates until a placement of a minimum number of power gating switches is found that guarantees compliance with the electrical specifications.

6 Claims, 6 Drawing Sheets

Table I. Illustration of execution of the placement algorithm.

| Iteration Index | # Switches | Fraction of total area of voltage island | # Violations |
|---|---|---|---|
| Iteration 0 | 36 | 3.71 % | 0 |
| Iteration 1 | 10 | 1.03 % | 6 |
| Iteration 2 | 11 | 1.13 % | 2 |
| Iteration 3 | 12 | 1.23 % | 0 |

FIG. 4

AUTOMATED AND ELECTRICALLY ROBUST METHOD FOR PLACING POWER GATING SWITCHES IN VOLTAGE ISLANDS

FIELD OF THE INVENTION

The field of the invention is related to design methods for integrated circuits and more particularly to an efficient and automated method of placing voltage gating switches within a discrete voltage domain (island) of an integrated circuit.

BACKGROUND OF THE INVENTION

Process technology trends in semiconductor manufacturing suggest that power dissipation is a major design challenge in high performance VLSI chips. For all circuit applications it is highly desirable to reduce and limit power dissipation in deep sub-micron semiconductor designs. In high performance server applications, for example, power dissipation leads to expensive packaging and cooling solutions. On the other end of the performance spectrum, the widespread use of battery operated devices, such as lap top computers, mobile phones and personal digital assistants (PDA's)—without significant advances in battery technology—creates an urgent need to address power dissipation in integrated circuits.

Consistent with constant electric field scaling, semiconductor power supply voltages have been reduced by thirty percent with each technology generation. The reduction in power supply voltage is necessary to manage active power dissipation as well as to maintain circuit reliability. With power supply voltage scaling, the device threshold voltage ($V_t$) must be reduced to maintain or improve performance. Depending on the process technology, this reduction in $V_t$ leads to an exponential increase in sub-threshold leakage current, which, in some cases, may represent the primary source of power dissipation in the chip. Indeed, for current microprocessor designs, power dissipation due to sub-threshold leakage current constitutes 40-50 percent of total chip power. Consequently, a clear need exists to develop novel techniques for controlling and reducing leakage power, especially since leakage power is expected to grow by a factor of five with each new generation of process technology.

Techniques for the control and reduction of sub-threshold leakage current may be divided into two approaches: static and dynamic. The static approach to low-leakage circuit design is directed to circuit geometries rather than to a functional aspect of the circuit. Such circuit design techniques are intended to reduce leakage current regardless of the mode of chip operation. Dynamic techniques, on the other hand, allow the dynamic control of certain functional blocks of the design during functional operation. In this regard, dynamic techniques involve setting certain functional blocks of the chip into low-leakage mode when they are in "idle" or "sleep" state. Power gating is one common dynamic leakage control mechanism that involves turning off the power supply when the functional block is in idle state. This is achieved by connecting a transistor, referenced as the sleep transistor or power gating switch, in series with the power supply of the logic block. When the functional block is in sleep state, the sleep transistor is turned off, thereby reducing the power dissipated by the logic block. In practice, a network of power gating switches may be necessary to efficiently control and reduce leakage power dissipation.

Power gating techniques involve partitioning the chip into functional logic blocks that may be selectively powered up or down. Circuits that may be periodically powered down are isolated from the primary power distribution network by placing them in voltage islands. A voltage island represents a predefined block of circuitry incorporating an internal power distribution network that is isolated from the primary power distribution network of the integrated circuit.

The power gating switch is a large transistor providing connectivity between the primary power distribution network of the integrated circuit and the voltage island power distribution network. The number of power gating switches necessary to supply the electrical load of the voltage island is dependent on the physical area and capacitive loading of the active circuitry contained within the voltage island. The power gating switches enable the circuitry within the voltage island to be disconnected from the primary power distribution network to reduce the total power dissipation of the integrated circuit during periods when the voltage island circuitry is in idle state.

By turning on the power gating switch, the voltage island and the chip-level power distribution networks are connected and power is supplied to the circuits in the voltage island from the chip power grid through the power gating switches. Conversely, turning off the power gating switch disconnects the voltage island power grid from the chip power grid, thus reducing power dissipation since the circuits in the voltage island are disconnected from the power supply.

FIG. 1 shows a prior art schematic diagram of a voltage island with power gating switches connecting the voltage island power grid 101, 102 and the chip power distribution networks 103, 104. The power gating switches are modeled as PFET transistors and labeled as $S_0, S_1, \ldots, S_n$ in the schematic. As shown in the schematic in FIG. 1, the chip-level circuits 105 draw power from the chip VDD and GND power grids 103, 104 while the voltage island circuits 106 draw power from voltage island VDD and GND power grids 101, 102. Power supplied to the voltage island is controlled by the power gating switches 100.

Due to the significant physical area of typical a power gating switch, a large number of switches in a voltage island will consume a significant portion of the total voltage island area. Thus, it is desirable to minimize the number of switches in a voltage island. However, it is important to have enough switches to guarantee the electrical robustness of the voltage island power distribution. For instance, the power gating switch design specification dictates a maximum current limit, $I_{PGS}$ that can be supplied through the switch. Hence, a minimum of $N_{PGS}=I_{VI}/I_{PGS}$ switches are needed to supply a total current, $I_{VI}$ to the voltage island.

SUMMARY OF THE INVENTION

According to a first embodiment, a method of placing a minimal number of power gating switches in a voltage island while ensuring the electrical robustness of that voltage island is disclosed. A power gating switch is typically designed to meet certain specifications in terms of how large it is and how much current it can carry. The physical area of the power gating switch FET is proportional to the current carrying capability of the switch. Given a specification for the power dissipated by the circuitry within a voltage island, a minimal number of power gating switches is required to supply power to the voltage island. However, because the power gating switches occupy a significant portion of the physical area of the voltage island, it is important to minimize the number of power gating switches used to power the voltage island to reduce the area occupied by these switches. Furthermore, it is extremely important to maintain the electrical integrity of the power grid of the voltage island, which often necessitates a unique placement of power gating switches. In general, the electrical integrity of the power grid is defined in terms of a maximum allowable voltage drop across the metal wires constituting the power grid.

In the first embodiment a novel and automated method is presented to place power gating switches in a voltage island. The placement guarantees the electrical robustness of the voltage island, such that the voltage drops within the power distribution grid of the voltage island are all within the allowable limits. Further, the reliability of the power gating switches is optimized by ensuring that the current specification for every power gating switch is not exceeded. Finally, the total area occupied by the power gating switches is limited by reducing the number of switches needed to supply power to the voltage island.

BRIEF DESCRIPTION OF THE DRAWINGS

FIG. 4 shows a table illustrating the execution of the placement algorithm shown in FIG. 3.

DETAILED DESCRIPTION OF THE PREFERRED EMBODIMENTS

In the following detailed description of embodiments, reference is made to the accompanying drawings which form a part hereof, and in which are shown by way of illustration specific embodiments that are described in sufficient detail to enable those skilled in the art to practice the invention, and it is to be understood that other embodiments may be utilized and logical, structural, electrical and other changes may be made without departing from the scope of the present invention.

A method and system are presented to efficiently place a network of power gating switches that guarantees the reliability and electrical robustness of the voltage island power grid, such that the voltage drops (IR) are within user-specified thresholds and the branch currents are less than the technology specified electro-migration (EM) current limits computed for a specified temperature and power-on hours criteria. Electrical robustness also includes satisfying maximum current limits that can be supplied by the power gating switches.

Figure 1:
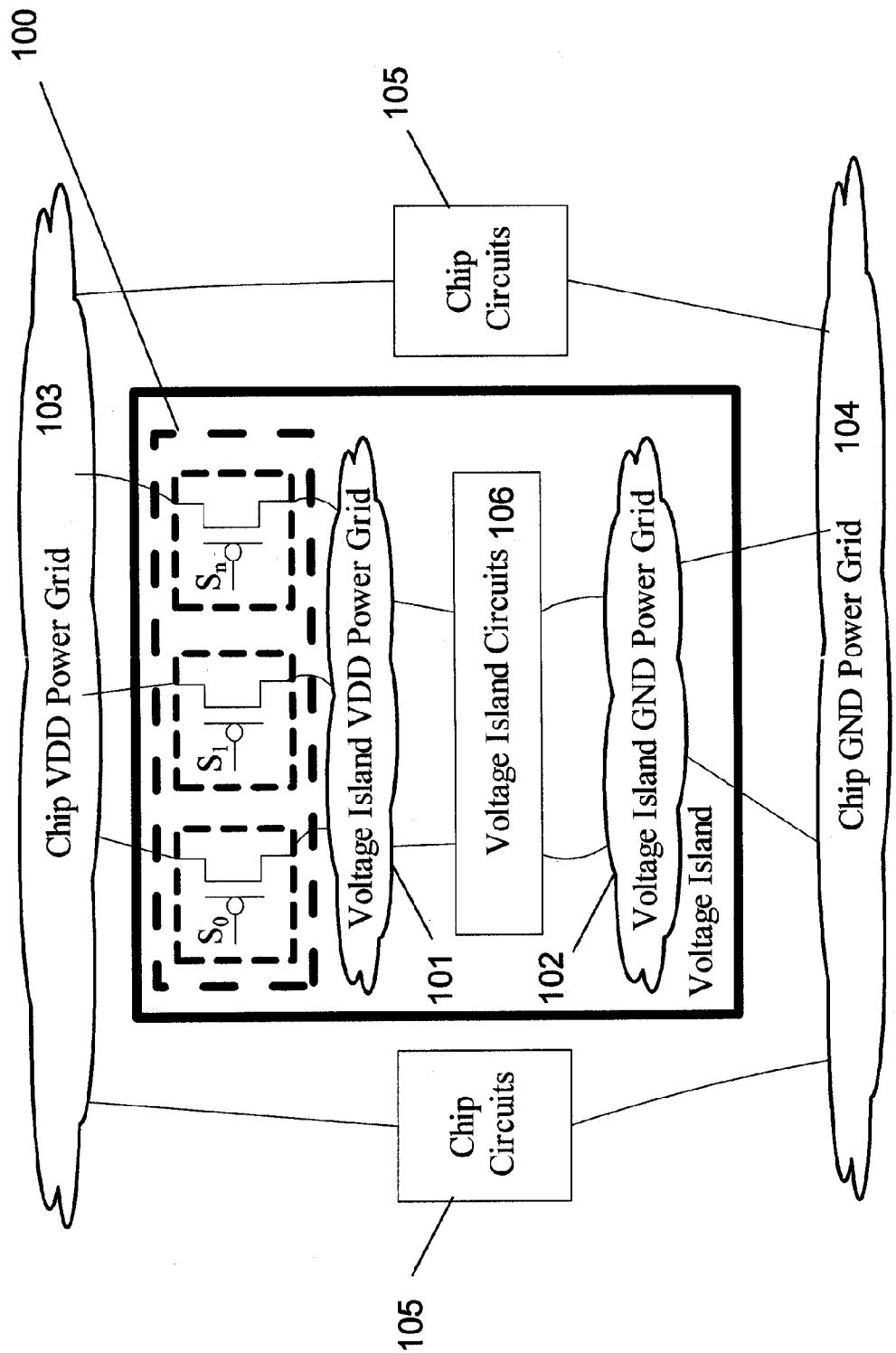
FIG. 1 illustrates a schematic block diagram of a voltage island and power gating switches connecting the voltage island and chip power distribution networks.
Figure 2:
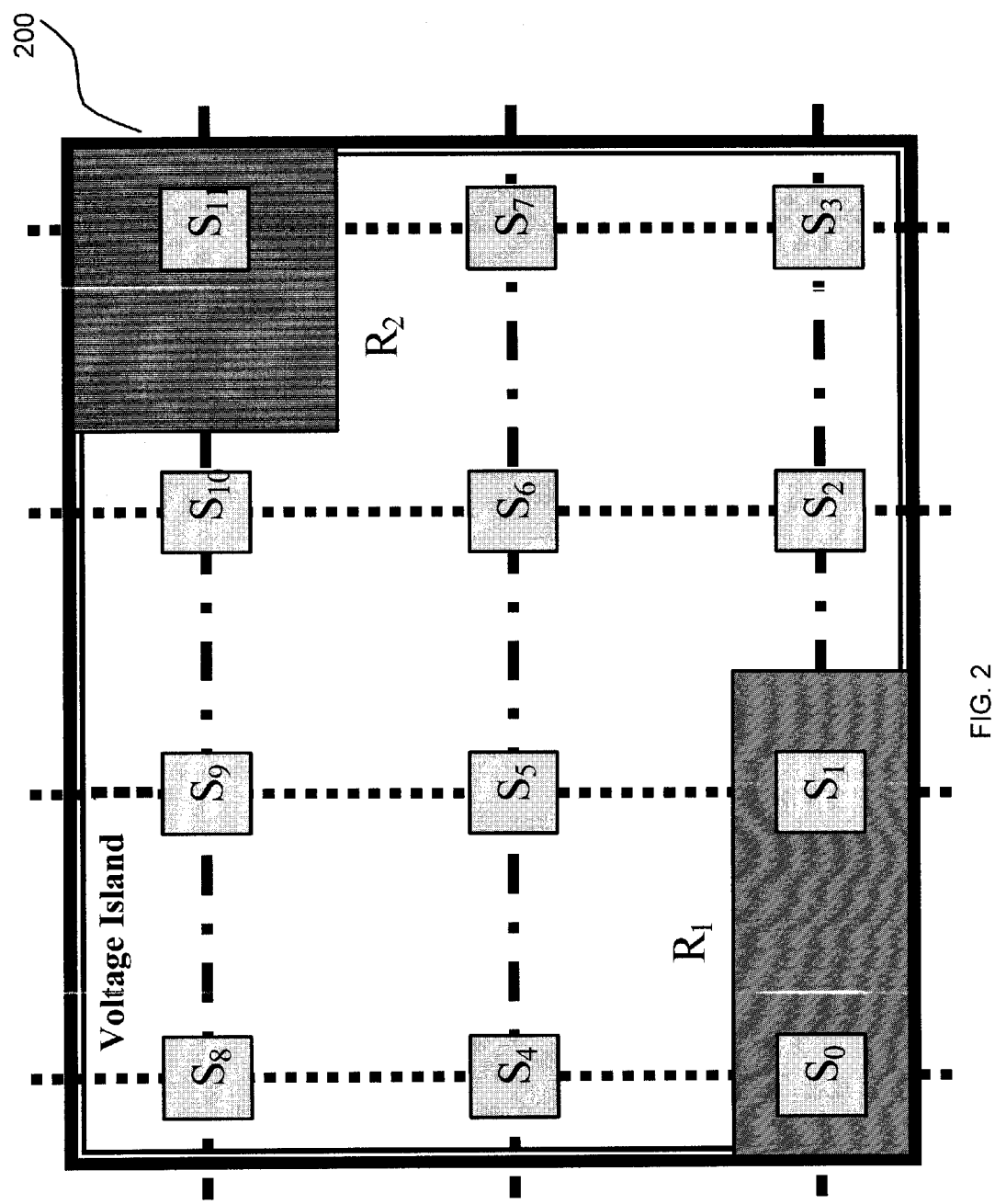
FIG. 2 illustrates a physical description of a voltage island with power gating switches placed at all physically legal locations.

In FIG. 2 a physical description of a voltage island and a set of power gating switches placed at all physically legal locations is shown 200. A legal physical location is defined as a legal location as reported by the physical design system. Namely, that a power gating switch placed in a legal location will not overlap blockage areas and will satisfy any physical requirements of snapping to a certain grid index. The current demand inside the voltage island may be non-uniform as illustrated in FIG. 2, where shaded areas, $R_1$ and $R_2$ represent different power densities than the rest of the island. The non-uniform power densities demand a specific placement of the switches to guarantee electrical robustness. If the power densities of shaded areas R1 and R2 are assumed to be higher than the rest of the island, it intuitively follows that switches $S_0$, $S_1$, and $S_{11}$ are more critical than the other switches in the voltage island. The disclosed algorithm, described infra, would exactly report switches $S_0$, $S_1$, and $S_{11}$ as being required to meet the electrical specifications of the voltage island. The algorithm also identifies other switches that may be needed to supply the current demanded by the circuits in the voltage island while guaranteeing electrical robustness.

Currently, the industry utilizes a simple approach for placing power gating switches in a voltage island. Existing techniques uniformly distribute a fixed number of switches across the voltage island. The number of switches is typically obtained based on the power (or equivalently, current) demand of the voltage island. Furthermore, other techniques have been proposed for performing electrical analysis to check the electrical robustness of the power distribution in a voltage island as outlined in U.S. Pat. No. 6,631,502 B2 issued to Buffet, et al., which is incorporated herein by reference.

For the physical layout presented in FIG. 2, every power gating switch $S_n$ is presumed to be capable of supplying a maximum current of $I_{PGS}$=10.0 mA. Similarly, the total current demand of the voltage island is given to be $I_{VI}$=100.0 mA. Thus, the minimum number of switches needed in the layout is $N_{PGS}=I_{VI}/I_{PGS}$=100.0/10.0=10. Although only 12 switches are shown in FIG. 2, the maximum number of switches is defined as $N_{total}$=36. The total current is distributed in a similar manner to what is shown in FIG. 2.

Figure 3:
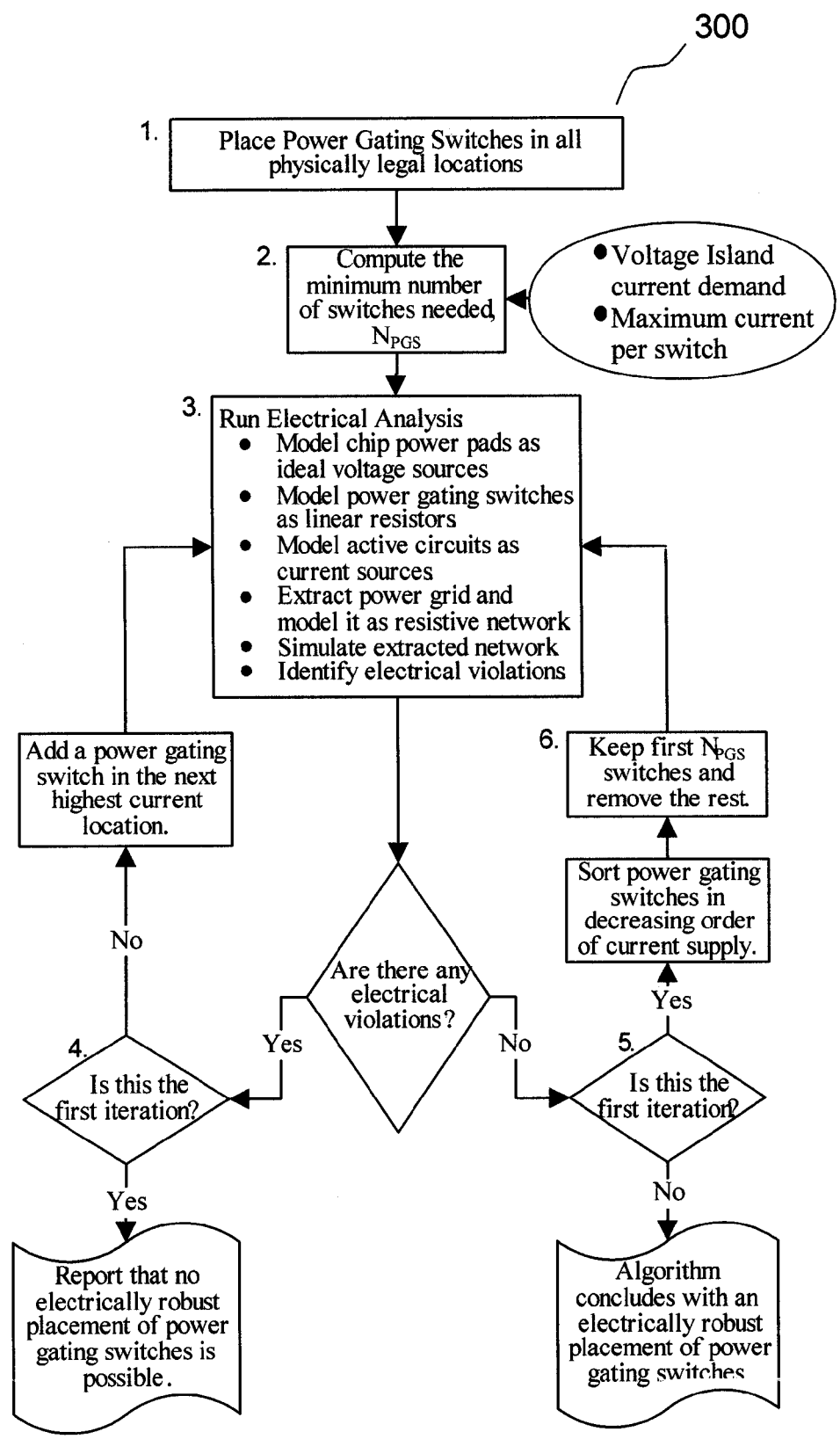
FIG. 3 depicts a flow diagram of the disclosed method according to a first embodiment.

The placement algorithm according to the first embodiment is illustrated in the flow diagram 300 shown in FIG. 3. In step 1, a power gating switch is placed at every legal location. Because of physical limitations related to the power grid geometry, there is typically a finite number, $N_{total}$, of legal physical locations where power gating switches may be placed in a voltage island. In an exemplar case, the total current is distributed in a manner similar to what is shown in FIG. 2. Namely, the upper right and lower left corner areas of the voltage island are assigned a current demand of 45.0 mA, and the rest of the voltage island is assigned a current demand of 10.0 mA.

Given the total current demand of the voltage island, $I_{VI}$, and the maximum current that can be supplied by a power gating switch, $I_{PGS}$, a minimum number of power gating switches is then calculated in step 2, wherein $N_{PGS}=I_{VI}/I_{PGS}$, which will ensure compliance with the electrical constraints of the voltage island.

In step 3, an electrical analysis is performed on the voltage island requiring every on chip power service terminal pad to be modeled as an ideal voltage source and each instantiated power gating switch to be modeled as a linear resistor. The value of the linear resistor is obtained from the slope of the I-V curve of the switch when operated in the linear region. The resistivity characteristics of the power distribution networks for both the full chip and the voltage island are extracted and then modeled as a resistive network.

Active circuitry within the voltage island is modeled with ideal current sources. However, for those circuits not yet placed, a uniform distribution of the current across the voltage island is presumed. The final step in the electrical analysis, is to simulate the extracted linear network to obtain the magnitude of the voltage drops at all circuit macro locations within the voltage island. Similarly, the currents in all branches of the voltage island power grid as well as the currents through each power gating switch are also computed. The simulation results will identify any violations of the electrical constraints in the power distribution network and power gating switch configuration of the voltage island. In this regard, a voltage drop in excess of an allowed threshold or a current demand larger than a specified limit for a power gating switch will both be flagged.

If any electrical violations are reported after a first iteration (decision block at step 4) when all possible power gating switches are placed, then the algorithm terminates and reports that the current demand for the voltage island cannot be met without violating electrical constraints. Conversely, if a violation of electrical constraints is reported on a subsequent iteration before the full population of legally placed power gating switches is realized, then an additional power gating switch is placed in the next highest current location, which is reported in a list of power gating switches sorted by descending order with respect to current demand.

If no electrical violations are reported after a first iteration (decision block at step 5), the placed power gating switches are again sorted by descending order with respect to current demand and those switches not supplying a maximum current are removed from the voltage island ($N_{total}$-$N_{PGS}$) and the algorithm continues. On a subsequent iteration, if no violations are reported, the algorithm concludes with an optimized placement of all power gating switches in the voltage island that meets the stated electrical constraints.

The proposed algorithm provides two principal advantages. First, it minimizes the physical area consumed by the power gating switches. This advantage is realized by starting with the minimum number of switches placed at areas of high current demand as reported by an initial DC simulation of the system. Ultimately, the technique reduces the total area overhead for power gating switches by reducing the number of switches needed to supply the current demanded of the voltage island. Second, the approach also provides a placement technique that is integrated with electrical analysis to guarantee the satisfaction of all electrical constraints, including a maximum voltage drop and a maximum current per switch. If no placement of power gating switches can guarantee all electrical constraints are met then an error report is generated for the user.

Secondary benefits include returning the exact numerical current value supplied by each power gating switch, which offers the flexibility to efficiently select from a set of switches that trade off area for current supply capability. In addition, the technique is automated and may be run at an early phase of the physical design and integration cycle when it is easier to make physical design changes to meet electrical constraints. The approach requires no predefined knowledge of the power bus structure and can handle any structure efficiently.

The algorithm easily accounts for technology issues such as edge bias and temperature. Metal shape edge bias used in semiconductor manufacturing is different for wide vs. narrow metal shapes, therefore not all busses will have the same bias. Operating temperature, a user defined environment parameter, affects metal resistivity, with higher temperatures causing higher resistivity for all busses.

Experimental results have been obtained using a linear circuit simulator for electrical analysis as outlined in the simulation sequence of the algorithm. The proposed algorithm is illustrated by applying it to place the power gating switches in a voltage island on an application specific integrated circuit (ASIC) design.

The results of executing the algorithm are reported in FIG. 4. The first column shows the iteration index of executing the algorithm. The number of switches used in the iteration is reported in the second column, and the third column shows the fraction of the total voltage island area occupied by the placed switches. The last column reports the number of electrical violations reported by the electrical analysis tool. In this example according to the first embodiment, the reported violations correspond to exceeding the current limits of the switches. The voltage drops are within the allowed threshold and the branch currents are smaller than the EM limits.

Figure 5:
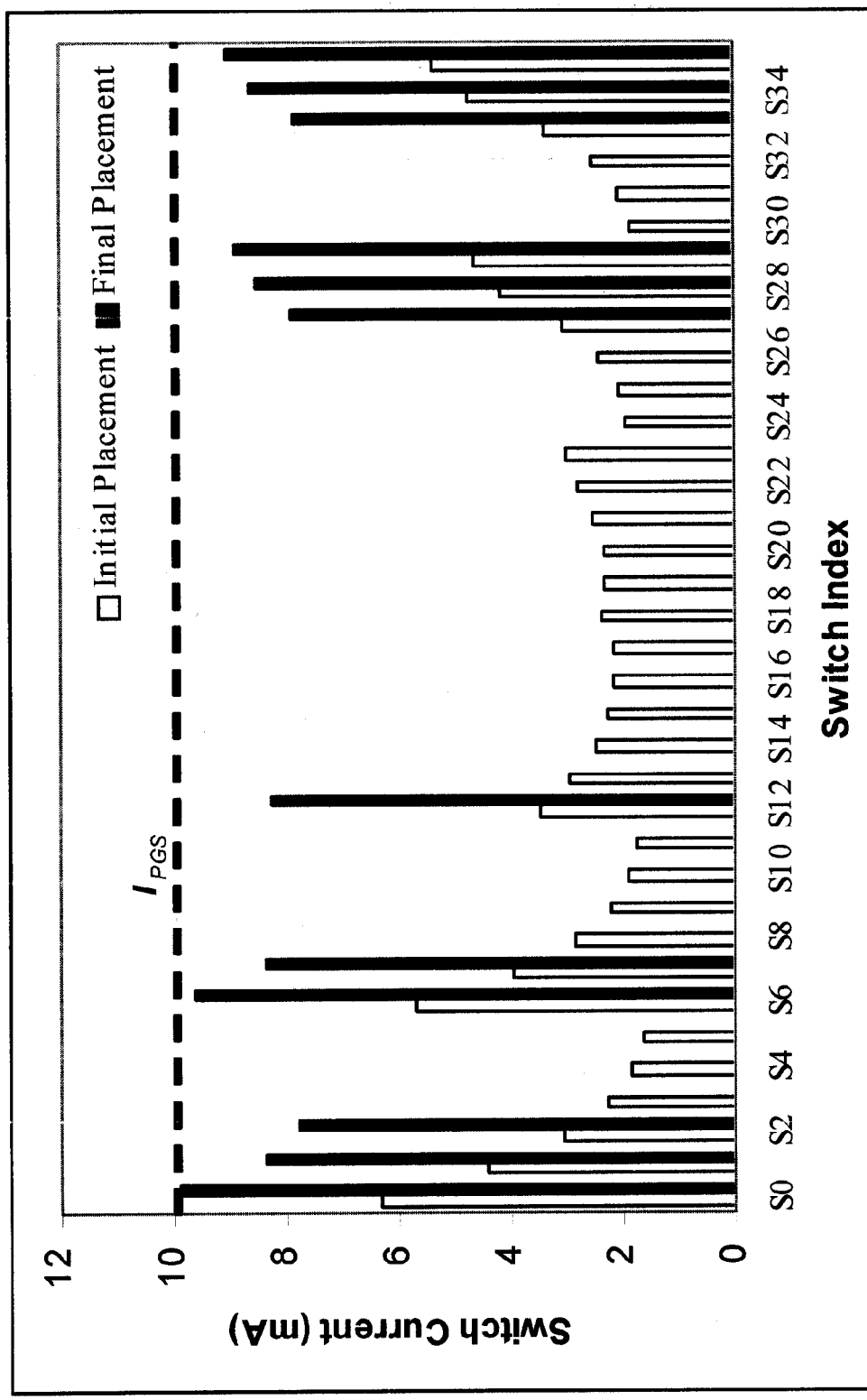
FIG. 5 illustrates a plot of the current distribution supplied through the power gating switches for an initial and final placement solution.

FIG. 5 shows the distribution of the current supplied by the switches after their initial and final placements. The first set of data corresponds to the initial placement current distribution where switches are placed at all legal locations. The second set of data corresponds to the final placement where only needed switches are placed. The dashed line in FIG. 5 represents the maximum current limit that can be supplied by each switch ($I_{PGS}$). It is clear from FIG. 5 that the initial placement using all 36 switches results in each switch supplying an amount of current well below $I_{PGS}$. Conversely, the final placement is implemented with a total of 12 power gating switches, each supplying close to its maximum specified current.

Figure 6:
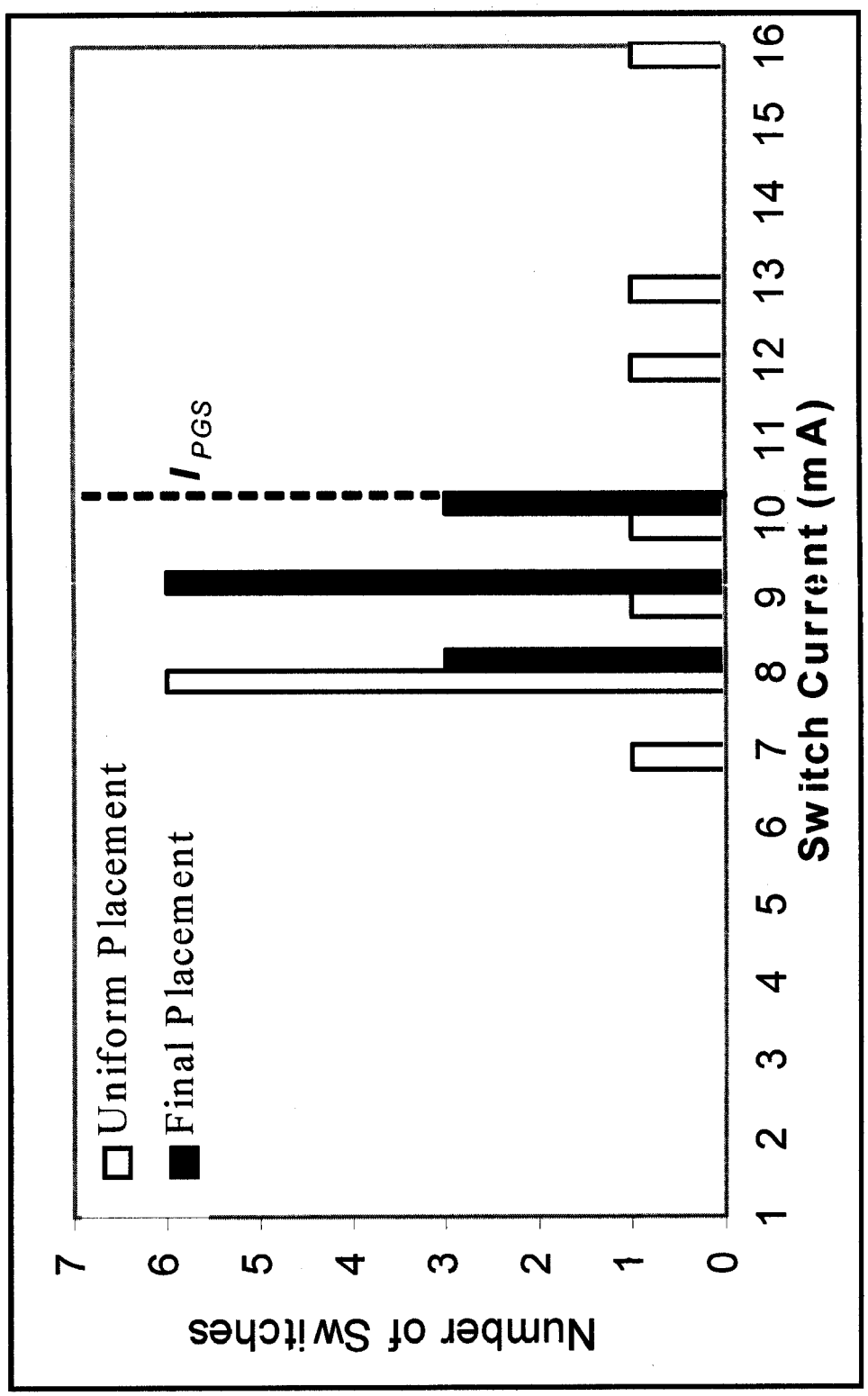
FIG. 6 illustrates a plot comparing the current supplied through the power gating switches for a geometrically uniform placement and the placement method according to the first embodiment.

In FIG. 6, a comparison of the individual currents for the uniform placement method and the disclosed placement method is shown. As indicated in FIG. 6, a uniform placement of the same number of switches cannot satisfy the electrical constraints of the voltage island without exceeding the individual current limits of three power gating switches. The histogram in FIG. 6 shows the current supplied through the switches when a uniform placement of 12 switches is applied as opposed to using the proposed method. For this case, the locations of the 12 uniformly placed switches are chosen independently of the original 36 total legal locations. Namely, 12 switches are placed uniformly to physically span the voltage island without consideration of local electrical constraints. FIG. 6 illustrates that a uniform placement results in 3 switches exceeding the maximum current limit ($I_{PGS}$), which is highlighted with the dashed line in FIG. 6. The proposed method, on the other hand, results in a placement of the switches where the maximum current limits for each switch are satisfied. Simulation results show that the algorithm reduces the area overhead due to the power gating switches from approximately 3.71% to approximately 1.23% of total voltage island area.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of placing a plurality of power gating switches within a voltage island of an integrated circuit, the method comprising:

a. placing a power gating switch at each one of a plurality of physical locations within the voltage island, the voltage island comprising a power distribution network;

b. calculating the minimum number of power gating switches required to satisfy a specification of electrical constraints;

c. performing an electrical analysis on the voltage island to determine whether the minimum number of power gating switches calculated in the previous step satisfies the specification of electrical constraints;

d. reporting a location on the integrated circuit of a violation of the electrical constraints from the electrical analysis step;

e. placing an additional power gating switch in close proximity to the location of where a violation was detected to provide additional current;

f. iterating steps c through e above until no violations are reported or a determination is made that the electrical constraints cannot be satisfied; and sorting the power gating switches in decreasing order of a total current supplied if no violations are reported after a first iteration;

removing a power gating switch corresponding to the last entry of the sort in the previous step and iterating steps c through f; and concluding the method steps after two or more iterations when a placement is found that satisfies the electrical constraints.

2. The method according to claim 1, further comprising:
reporting that the electrical constraints cannot be satisfied if a violation is reported after a first iteration.

3. The method according to claim 1, wherein the step of computing the minimum number of power gating switches further comprises:

determining a total current demand of the voltage island; and specifying a maximum current for each one of the plurality of power gating switches.

4. The method according to claim 1, wherein the specification of electrical constraints comprises:

a voltage drop specification for each one of a plurality of circuit elements contained within the voltage island; and a current to be supplied to the voltage island when the voltage island is connected to a primary power distribution network.

5. A program storage device readable by a machine, tangibly embodying a program of instructions executable by the machine to perform method steps for placing a plurality of power gating switches within a voltage island of an integrated circuit, said method steps comprising:

a. placing a power gating switch at each one of a plurality of physical locations within the voltage island, the voltage island comprising a power distribution network;

b. calculating the minimum number of power gating switches required to satisfy a specification of electrical constraints;

c. performing an electrical analysis on the voltage island to determine whether the minimum number of power gating switches calculated in the previous step satisfies the specification of electrical constraints;

d. reporting a location on the integrated circuit of a violation of the electrical constraints from the electrical analysis step;

e. placing an additional power gating switch in close proximity to the location of where a violation was detected to provide additional current; and f. iterating steps c through e above until no violations are reported or a determination is made that the electrical constraints cannot be satisfied;

the program of instructions for the electrical analysis step further comprises modeling each of the plurality of power gating switches as a resistor;

modeling the power distribution network of the voltage island as a resistive network;

modeling a power distribution network of the integrated circuit as a resistive network;

modeling each of a plurality of circuit elements contained within the voltage island as a current source;

modeling each of a plurality of power pads contained within the integrated circuit as an ideal voltage source;

simulating a response of the modeled elements in steps a through e above using a DC stimulus; and determining a voltage drop at the location of all placed circuits in the voltage island, the current in each of a plurality of current paths within the voltage island, and the current supplied by each of the plurality of placed power gating switches based on the simulation performed in the previous step;

wherein the program of instructions for the electrical analysis step further comprises, sorting the power gating switches in decreasing order of a total current supplied if no violations are reported after a first iteration;

removing a power gating switch corresponding to the last entry of the sort in the previous step and iterating steps c through f; and concluding the method steps after two or more iterations when a placement is found that satisfies the electrical constraints.

6. A system for placing a power gating switch within a voltage island of an integrated circuit, the system comprising:

a. instructions for placing a power gating switch at each one of a plurality of physical locations within the voltage island, the voltage island comprising a power distribution network;

b. instructions for calculating the minimum number of power gating switches required to satisfy a specification of electrical constraints;

c. instructions for performing an electrical analysis on the voltage island to determine whether the minimum number of power gating switches calculated in the previous step satisfies the specification of electrical constraints;

d. instructions for reporting a location on the integrated circuit of a violation of the electrical constraints from the electrical analysis step;

e. instructions for placing an additional power gating switch in close proximity to the location of where a violation was detected to provide additional current and f. instructions for iterating steps a through e above until no violations are reported or a determination is made that the electrical constraints cannot be satisfied;

wherein, the system further comprises:

instructions for sorting the power gating switches in decreasing order of a total current supplied if no violations are reported after a first iteration;

instructions for removing a power gating switch corresponding to the last entry of the sort in the previous step and iterating steps c through f; and instructions for concluding the method steps after two or more iterations when a placement is found that satisfies the electrical constraints.

* * * * *